(12) United States Patent
Buchanan (10) Patent No.: US 10,056,141 B2
(45) Date of Patent: Aug. 21, 2018

(54) CURRENT BEHAVIOR OF ELEMENTS

(71) Applicant: Hewlett Packard Enterprise Development LP, Houston, TX (US)

(72) Inventor: Brent Buchanan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/318,000

(22) PCT Filed: Jul. 30, 2014

(86) PCT No.: PCT/US2014/048800
§ 371 (c)(1),
(2) Date: Dec. 12, 2016

(87) PCT Pub. No.: WO2016/018281
PCT Pub. Date: Feb. 4, 2016

(65) Prior Publication Data
US 2017/0133088 A1 May 11, 2017

(51) Int. Cl.
*G11C 16/10* (2006.01)
*G11C 13/00* (2006.01)

(52) U.S. Cl.
CPC ............ *G11C 13/004* (2013.01); *G11C 16/10* (2013.01)

(58) Field of Classification Search
CPC .......................... G11C 13/0069; G11C 16/10
USPC ............................................ 365/148, 185.24
See application file for complete search history.

(56) References Cited

U.S. PATENT DOCUMENTS

| | | | | |
|---|---|---|---|---|
| 4,434,478 A | * | 2/1984 | Cook | G11C 16/34 365/104 |
| 5,687,116 A | * | 11/1997 | Kowshik | G11C 16/12 365/185.03 |
| 6,208,497 B1 | * | 3/2001 | Seale | F01L 9/04 361/154 |
| 7,221,199 B2 | * | 5/2007 | Chung | H03K 3/356008 323/901 |
| 7,339,180 B2 | * | 3/2008 | Kitchen | G01R 19/0061 250/283 |
| 7,772,550 B2 | * | 8/2010 | Schaefer | H01J 49/0031 250/281 |
| 7,849,712 B2 | | 12/2010 | Parkinson | |
| 7,889,523 B2 | * | 2/2011 | Cook | H02M 3/07 327/536 |

(Continued)

OTHER PUBLICATIONS

Ciocchini, N., et al., Threshold Voltage Drift in Phase Change Memories: Scaling and Modelling, Mater. Res. Soc. Symp. Proc., Materials Research Society, 2012, pp. 1-6.

(Continued)

*Primary Examiner* — Michael Tran
(74) *Attorney, Agent, or Firm* — Hewlett Packard Enterprise Patent Department (57) ABSTRACT

An example device in accordance with an aspect of the present disclosure includes a first module, a second module, and a third module. The first module is coupled to an element whose status is to be determined, and the first module is to receive an input current that increases over time. The second module is to perform a temporal derivative of a voltage across the element. The third module is to provide an output signal based on a current behavior of the element, according to a change in voltage as a function of a change in current.

15 Claims, 5 Drawing Sheets

(56) References Cited

U.S. PATENT DOCUMENTS

| | | | | |
|---|---|---|---|---|
| 7,920,407 | B2* | 4/2011 | Chen | G11C 13/0007 365/148 |
| 7,986,549 | B1* | 7/2011 | Tang | G11C 13/0004 365/163 |
| 8,054,707 | B2* | 11/2011 | Ware | G11C 11/406 365/185.19 |
| 8,130,536 | B2 | 3/2012 | Karpov et al. | |
| 8,238,149 | B2 | 8/2012 | Shih et al. | |
| 8,278,828 | B1* | 10/2012 | Rutherford | B81B 7/04 315/169.1 |
| 8,344,638 | B2* | 1/2013 | Shteynberg | H05B 33/0815 315/185 S |
| 8,520,439 | B2* | 8/2013 | Tsai | G11C 16/3468 365/185.17 |
| 8,581,761 | B1* | 11/2013 | Bahukhandi | H03M 1/0863 341/118 |
| 8,654,559 | B2 | 2/2014 | Nakano et al. | |
| 8,698,706 | B1* | 4/2014 | Rutherford | G09G 3/3233 315/169.3 |
| 9,018,928 | B2* | 4/2015 | Dearborn | H02M 3/157 323/283 |
| 9,117,505 | B2* | 8/2015 | Kang | G11C 8/08 |
| 9,185,316 | B2* | 11/2015 | Cheon | H04N 5/361 |
| 9,225,923 | B2* | 12/2015 | Hashimoto | H04N 5/3696 |
| 9,232,165 | B2* | 1/2016 | Saito | H04N 5/3575 |
| 9,520,554 | B2* | 12/2016 | Rigano | H01L 45/12 |
| 9,711,213 | B2* | 7/2017 | Castro | G11C 13/0038 |
| 2004/0160796 | A1* | 8/2004 | Johnson | G01R 33/06 365/63 |
| 2006/0105321 | A1* | 5/2006 | Moy | G01N 33/5005 435/4 |
| 2006/0279979 | A1 | 12/2006 | Lowrey et al. | |
| 2009/0279370 | A1 | 11/2009 | Storms | |
| 2010/0128519 | A1 | 5/2010 | Liet et al. | |
| 2011/0058405 | A1 | 3/2011 | Chen et al. | |
| 2011/0211391 | A1* | 9/2011 | Parkinson | G11C 11/56 365/163 |
| 2014/0003139 | A1 | 1/2014 | Pickett et al. | |
| 2014/0112057 | A1 | 4/2014 | Sutardja et al. | |

OTHER PUBLICATIONS

International Searching Authority, the International Search Report and the Written Opinion, PCT/US2014/048800, Feb. 26, 2015, 9 Pgs.

\* cited by examiner

CURRENT BEHAVIOR OF ELEMENTS

BACKGROUND

Memory elements, such as memory cells that incorporate a selector, may have characteristics that will randomly vary across some distribution between cells. An approach to deal with such random variation involves reducing a read margin for the memory cells, i.e., imposing a need to use a read voltage for the memory cells that is higher than a worst-case value among the memory cells.

DETAILED DESCRIPTION

Example devices and methods described herein avoid or minimize a need to degrade a sensing read margin, e.g., in a sense amp for resistive random access memory (RRAM), phase change, magnetic (M) RAM, and other types of bit cells associated with corresponding selectors. The cells may have some distribution (random, Gaussian, etc.) of characteristics (e.g., selector threshold voltage variation). Examples may interact specifically and uniquely with the memory elements, e.g., based on a threshold voltage or other characteristic(s) that are determined on a per-cell basis, accommodating variation of element characteristics while preserving individual read margin.

Figure 1:
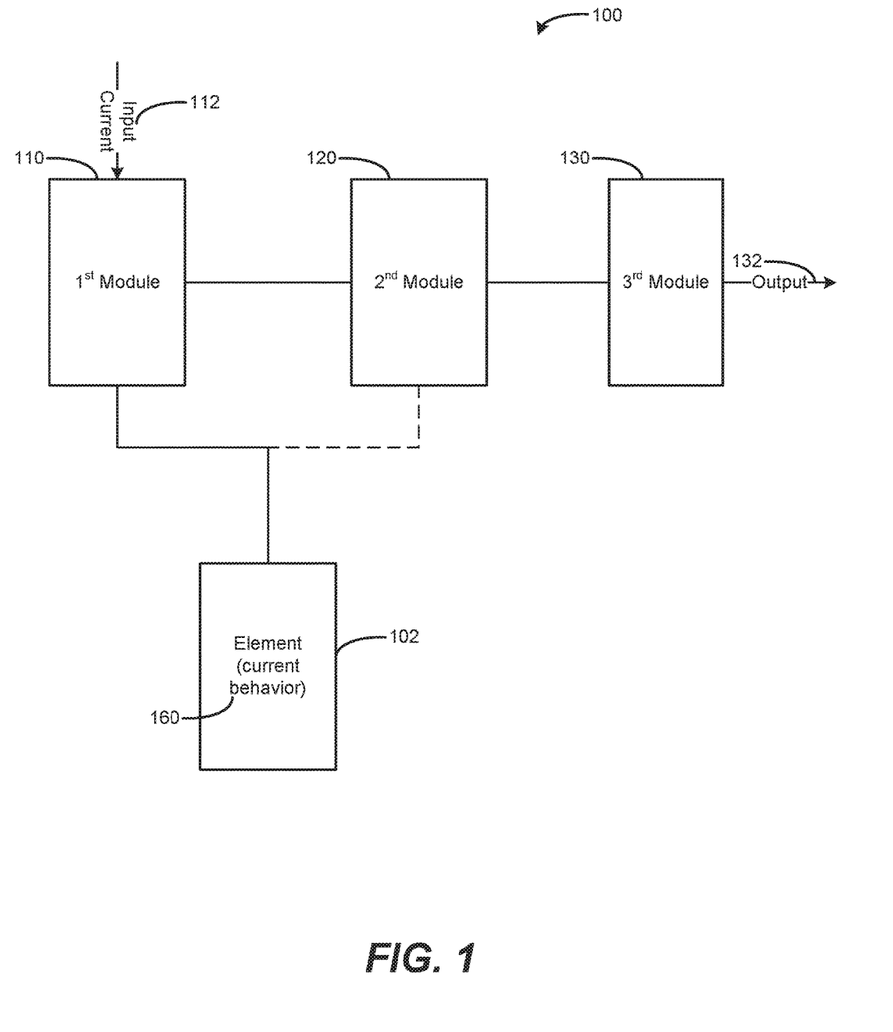
FIG. 1 is a block diagram of a device including modules according to an example.

FIG. 1 is a block diagram of a device 100 including modules 110, 120, and 130 according to an example. The first module 110 is to receive input current 112, and is coupled to element 102 whose status is to be determined (e.g., based on a current behavior 160 in response to the input current 112). Second module 120 is coupled to the first module 110, to apply a function to the element 102. The third module 130 is to provide an output signal 132 based on a behavior of the element 102.

The element 102 may be based on a switching cell, e.g., a memristor or other type of cell to be used as memory. The cell may be formed of tantalum oxide, hafnium oxide, or other materials that can exhibit a resistive memory behavior. The element 102 also may include a selector, in series with the cell. The selector may exhibit a non-linear behavior. Element 102 may be used to represent the series combination of a cell and selector. The element 102 may respond to various inputs, including input voltage and/or current, such as the input current 112.

The element 102 may be selectively identified in a crosspoint array of many elements 102, with each intersection of a column/row of the crosspoint including a memristor cell and a selector that form the element 102. A threshold voltage, e.g., for reading a memory state of an element 102, may differ from selector to selector of the various elements 102 of the crosspoint. Thus, first, second, and third modules 110, 120, and 130 of device 100 may be used to determine whether a given element 102 has exceeded a threshold read voltage, such that the selector for element 102 is ready to enable reading of a state of the cell that is in series with the selector for element 102. Principles described herein may be used similarly for writing or otherwise interacting with the cell/element, and for different types of elements 102, such as unipolar, bipolar, and multi-state memory cell/elements 102, including those having different characteristics (currents/voltages) for setting and erasing/resetting the element 102.

Characteristics may vary between different elements 102, and also may vary over a lifetime of an element 102 (including a threshold read voltage and/or write voltage). Examples described herein may determine, on-the-fly during operation, individual characteristics for a given element 102. Accordingly, examples may also accommodate variations in characteristics that may arise over a lifetime of the element 102, in addition to individually accommodating characteristics that may vary between different elements 102.

The first module 110 is to be coupled to the element 102 so that the first module 110 may provide the input current 112 to the element 102, and identify a current behavior 160 (and/or other behavior/characteristics, such as a voltage behavior) of the element 102. In a current-based example, the first module 110 may be based on a node, coupled to the element 102 and the second module 120, to receive the input current 112. In an alternate example, the first module 110 (and other modules) may be a voltage-based module, e.g., interacting with the input current 112, second module 120, and/or the element 102 according to voltage characteristics. A module also may be based on both current and voltage elements. The first module 110 may receive input current 112 that varies over time according to a function, such as a linear ramp. Accordingly, the first module 110 may deliver the ramp current to the element 102.

Second module 120 is to perform a temporal derivative of a voltage across the element 102. Thus, the second module 120 may be coupled to the element 102 and the first module 110. In an example, the second module 120 may include a component to identify a behavior of the element 102, such as by taking a derivative of a characteristic of the element 102. For example, the second module 120 may include a capacitor, and may identify a derivative of a voltage with respect to time of the element 102, e.g., by applying the input current 112 to the element 102. The second module 120 may include a second node that is coupled to the capacitor. In an alternate example, the second module 120 may be based on other components to observe other behavior of the element 102. For example, the second module 120 may include at least one operational amplifier (op-amp) to identify an integral of a characteristic of the element 102, and invert the integral information to obtain a derivative. Accordingly, the second module 120 is not limited to relying on a capacitor circuit element to obtain the derivative of the behavior of the element 102.

The third module 130 is to provide the output signal 132, based on the behavior of characteristics of the element 102 as identified by the first and/or second modules 110, 120. For example, the third module 130 may provide the output 132 according to a change in voltage associated with the element 102, as a function of a change in the input current 112 applied to the element 102. The third module 130 may be based on an output node that is coupled to the second module 120.

The first, second, and third modules 110, 120, and 130 are shown coupled to each other according to one example. In alternate examples, additional and/or different modules may be included. Similarly, additional and/or different couplings between modules may be included.

Figure 2:
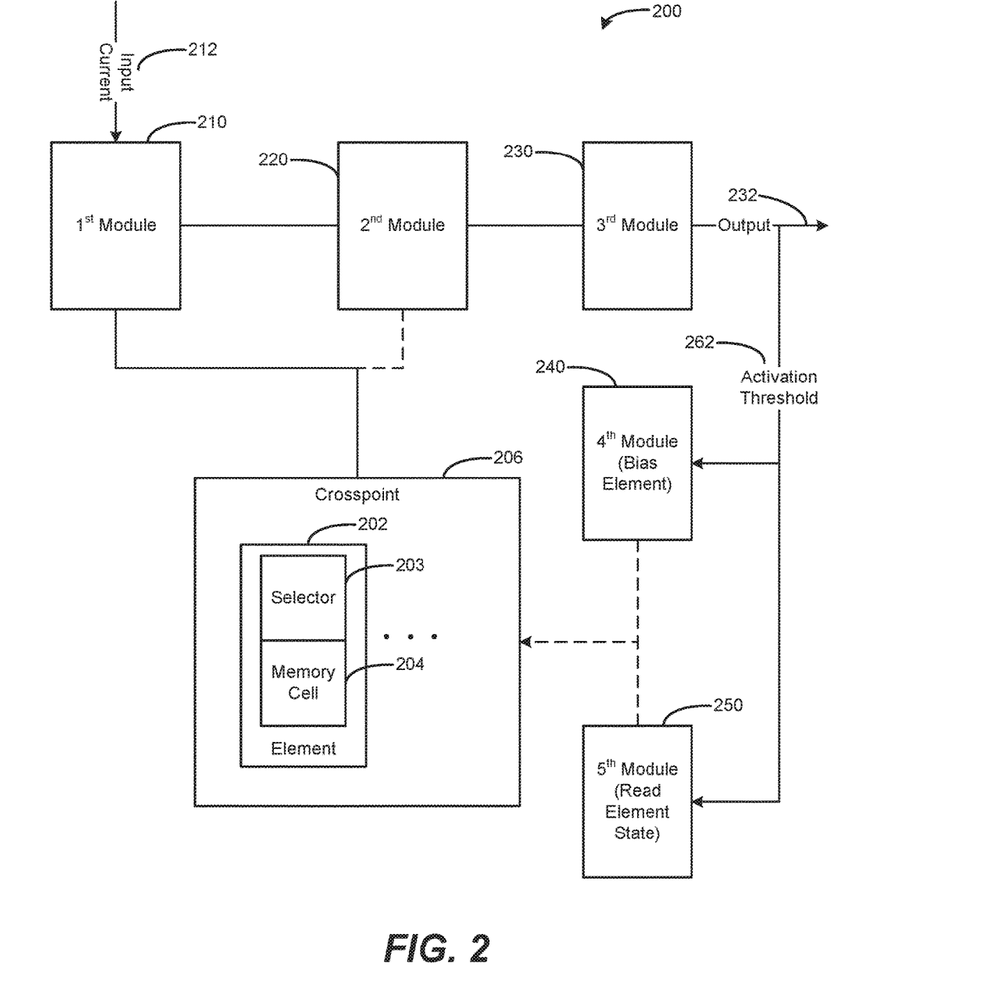
FIG. 2 is a block diagram of a device including modules according to an example.

FIG. 2 is a block diagram of a device 200 including modules 210, 220, 230, 240, and 250 according to an example. The first module 210 is to receive input current 212, and is selectively coupled to an element 202 via crosspoint 206. The element 202 includes a selector 203 and a memory cell 204. The second module 220 is coupled to the first module 210 and/or the crosspoint 206, to apply a function to the element 202. The third module 230 is to provide an output signal 232 based on a behavior of the element 202. The output 232 is to indicate an activation threshold 262, which may be used by the fourth and fifth modules 240, 250. The fourth module 240 may bias the element 202 based on the activation threshold 262. The fifth module 250 may read a state of the element 202 based on the activation threshold 262.

The example element 202 is shown as a bit cell of a crosspoint 206, including a series combination of a storage/memory cell 204 and a selector 203. The selector 203 may exhibit strongly non-linear behavior, e.g., a first behavior when not selected (e.g., below a selection voltage threshold), and a second (different) behavior when selected, based on the threshold voltage, e.g., to select an element 202 in the crosspoint 206. A common terminal between the selector 203 and the memory cell 204 in the element 202 is not accessible. For example, the crosspoint 206 may include a series of rows and columns for accessing the elements 202, without corresponding signal lines coupled individually to sub-elements of the element 202, such as a common terminal between the selector 203 and the memory cell 204. Accordingly, device 200 may identify characteristics and/or apply signals to the series combination of the selector 203 and the memory cell 204, based on selecting an element 202 and identifying and/or applying characteristics/signals to that selector 203/memory cell 204 series combination. Examples provided herein may provide insight into individual states of sub components within the element 202.

The first, second, and third modules 210, 220, 230 may be similar to the correspondingly labeled modules illustrated in FIG. 1. The fourth module 240 is coupled to identify an activation threshold 262 based on the output signal 232. The fourth module 240 is to bias the element 202 according to a particular activation threshold 262, e.g., that may be particularly suited to maximize a read margin of the element 202. For example, the fourth module 240 may bias the element 202 to just activate the selector 203, such that a storage state of the memory cell 204 is ready to be read, while biasing the element 202 at a voltage that is greatly separated from a higher write voltage. Accordingly, the element 202 may be read without risking an accidental write to the memory cell 204. Furthermore, the device 200 may approach the reading of the element 202 by minimizing risks, due to approaching the selection of the element 202 at the greatest distance/read margin from a voltage level that might write or reset the cell 204 (e.g., in view of accommodating variations in a selection voltage and a write voltage that might cause the two values to be relatively close to each other for a given element 202 among many in a crosspoint 206). Furthermore, the fourth module 240 is to tailor the particular level of bias applied to a given element 202, in view of the particular activation threshold 262 for that particular element 202, thereby maximizing a read margin for that element 202 on an individual basis.

The fifth module 250 is to read a state of the element 202. For example, the fifth module 250 may identify if the element 202 is in a first resistive state or a second resistive state. The fifth module 250 may perform the identification in response to the activation threshold 262 being identified for the particular element 202. Thus, the fifth module 250 may ensure that the reading of the state of the element 202 is accurate and precise, without risking an attempt to read the element 202 before it has been fully selected.

Figure 3A:
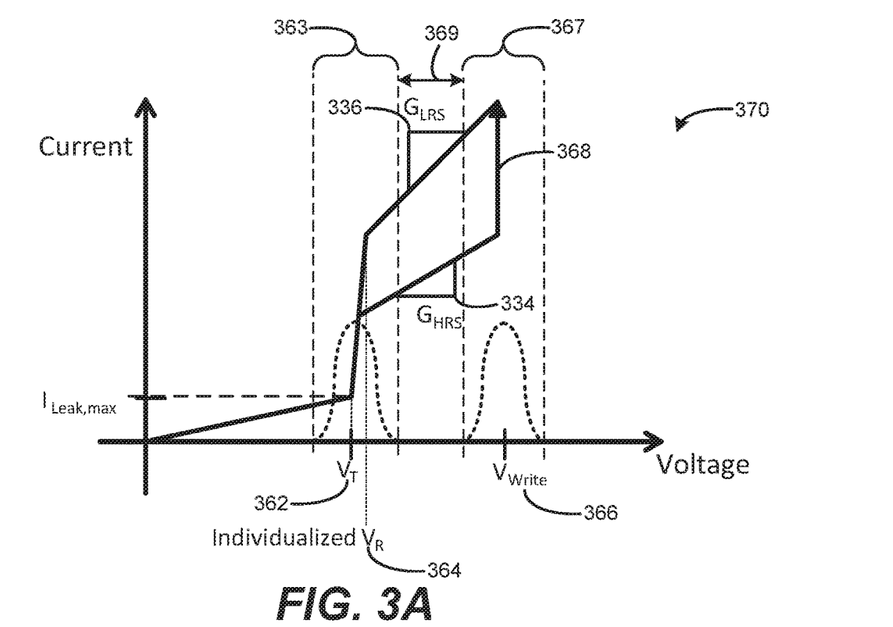
FIG. 3A is a diagram of a current vs. voltage characteristic of a device according to an example.

FIG. 3A is a diagram of a current vs. voltage characteristic (referred to herein as a voltage behavior 370, where voltage is swept as an input) of a device according to an example. The device is associated with an activation threshold voltage $V_T$ 362 (having a corresponding activation distribution 363) and a write threshold voltage $V_{Write}$ 366 (having a corresponding write distribution 367). The activation distribution 363 and the write distribution 367 are separated by a read margin 369. The device exhibits a behavior according to a high resistive state 334, a low resistive state 336, and a state change 368.

An example current-voltage (I-V) curve is shown for a bit-cell and selector (i.e., an element). Voltage is the independent variable and current is the dependent variable, corresponding to a voltage driven bit-cell/element. Variation (363, 367) is shown existing for both the selector activation threshold voltage 362 and the storage cell write threshold voltage 366. Accordingly, the variation (shown as a Gaussian curve having a non-zero width) crowds into a width of the read margin 369, resulting in a reduction in the read margin for the example sensing circuit corresponding to FIG. 3A.

The voltage behavior 370 illustrates a curve showing that, for small voltages below $V_T$, a high resistance/impedance state for a corresponding selector of an element conducts a small current, causing a corresponding shallow slope in the curve. Above some randomly varied value for the threshold voltage ($V_T$ 362) of this particular element (variance indicated by the Gaussian curve 363), the selector turns on and conducts well (due to a low resistive state), wherein a current passing through the bit-cell is determined by a state of the storage cell, showing a corresponding steep slope in the voltage behavior 370. The current/voltage is sufficiently high to enable identification of a difference between whether the element is in the low resistive state 336 (relatively larger vertical offset and larger slope) or the high resistive state 334 (smaller vertical offset and smaller slope). If in the high resistive state 334 (i.e., the unwritten state), at a high enough voltage, when the curve reaches $V_{Write}$ 366 for that element, the cell changes state. For example, changing from an unwritten high resistive state (HRS) to a written low resistive state (LRS), indicating that the cell has stored a bit in a bipolar cell. For bipolar cells generally, a similar I-V curve to that of voltage behavior 370 showing behavior of a set operation, also exists in Quadrant III, corresponding to resetting the cell from the LRS back to the HRS. For other types of cells, multiple different activation and/or threshold voltages may be involved. For example, for a unipolar cell, a first $V_{write}$ may be associated with setting the element, and a second $V_{write}$ may be associated with resetting the element (e.g., in the same Quadrant). A state change 368 is shown to illustrate the cell being written, from the high resistive state 334 to the low resistive state 336. The vertical arrow is to represent a 'zero time' event, causing the associated current for that $V_{write}$ voltage to increase once the state change 368 is triggered. Thus, a general approach is to apply enough voltage to cause an element's selector to turn on, to enable access to the switch portion of the bit cell associated with the selector to read and/or write the element.

In a collection of bit cells, the individual $V_T$ and $V_{Write}$ values will vary across some distribution (indicated by probability curves 363, 367), where a given cell will exhibit some fixed values for these variables. A window of operation is provided between the $V_T$ 362 and $V_{Write}$ 366, referred to as the read margin 369 for a bit-cell. If a collection of bit cells (e.g., a crosspoint) is addressed (without knowing individual thresholds for each cell), a lowest-common denominator effect would arise, resulting in a group of such bit cell elements to be operated according to the read margin 369 constrained on each side by the collection of randomly varying values. Accordingly, the example devices and methods described herein (e.g., sense amps) enable the biasing of a target cell/element in a zone of the read margin 369 for that particular cell, and determine the storage cell's state with a large cushion before infringing into the $V_{write}$ 366 zone 367.

Furthermore, examples herein provide additional safety due to approaching the $V_T$ and $V_{Write}$ from the left as illustrated (for each element, individually), gradually increasing the voltage until the selector threshold is found for that individual cell element. An individualized $V_R$ 364 also is shown, illustrating where the curve for the high resistive state 334 and the low resistive state 336 have diverged for ease of distinguishing one state from the other, e.g., based on a device module of the examples provided herein. Examples may identify an individualized $V_R$ 364 for an element, such that when reading a cell, a module may bias the cell on an individual basis precisely to the value of $V_R$ 364, to enjoy large divergence between the set/reset states, while remaining far to the left of the read margin 369. Furthermore, the $V_R$ 364 may be kept low, at a value no higher than needed to trigger the selector. This 'approach from below' maximizes a distance from the element's $V_{Write}$ 366 (whatever it is for this cell within the variation 367) when performing the read, thereby minimizing a chance of causing an inadvertent write, and also minimizing the value of the read current (that could potentially disturb the stored contents of an element, if the value is too high). Examples described herein may detect and identify behavior for an individual element when accessing that element (e.g., 'on-the-fly'), such that it is not necessary to store individual values (or average values across multiple elements) in advance.

Figure 3B:
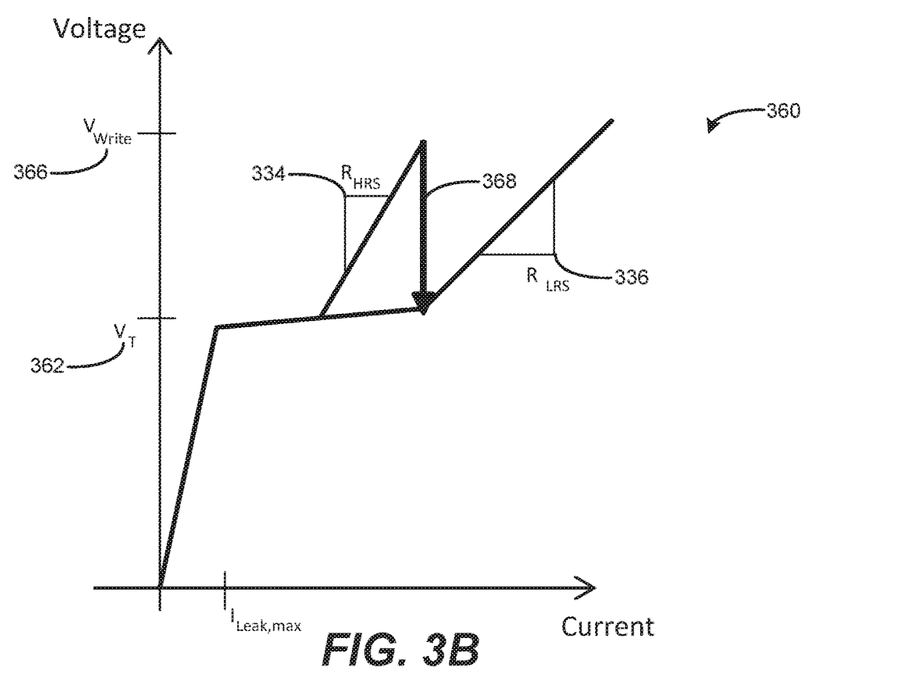
FIG. 3B is a diagram of a voltage vs. current characteristic of a device according to an example.

FIG. 3B is a diagram of a voltage vs. current characteristic (referred to herein as a current behavior 360, where current is swept as an input) of a device according to an example. The device exhibits the current behavior 360 according to an activation threshold voltage $V_T$ 362, a write threshold voltage $V_{Write}$ 366, a high resistive state 334, a low resistive state 336, and a state change 368.

For the current behavior 360, current is the independent variable and voltage is the dependent variable, i.e., for a current driven bit-cell. A cell driven with current as the independent variable results in a V-I curve similar to that of the I-V curve of FIG. 3A, but with the axes swapped. Thus, in contrast to the state change arrow of FIG. 3A pointing up, the state change arrow 368 of FIG. 3B points down, representing the zero-time setting event where voltage drops for a given current, associated with the state change from HRS to LRS.

Figure 4A:
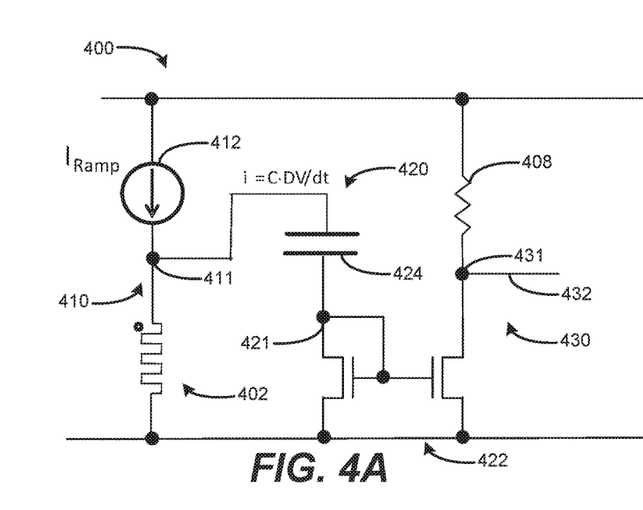
FIG. 4A is a circuit diagram of a device including modules according to an example.

FIG. 4A is a circuit diagram of a device 400 including modules 410, 420, and 430 according to an example. First module 410 includes a first node 411 coupled to an input current 412, an element 402, and a capacitor 424. The second module 420 includes a second node 421 coupled to the capacitor 424 and the current mirror 422. The third module 430 includes an output node 431, coupled to a resistor 408 and the current mirror 422, to provide output 432. Although one particular circuit diagram is illustrated, others are possible for identifying/generating the desired behavior consistent with the examples described herein. Device 400 illustrates an example DV/dt stage for a sense amp, capable of detecting a large change (DV/dt) associated with individually characterizing an element 402.

Generally, input current 412 may provide a current ramp to the element 402. The capacitor 424, according to a current behavior of I=C*DV/dt, will track voltage changes (e.g., caused at node 411 due to a resistance provided by a separate resistor, not shown, or a resistance associated with the element 402), based on a large DV/dt, such that current through the capacitor 424 also will exhibit a large change. This current change will be reflected to node 431, by current mirror 422, which may be converted to a voltage using the resistor 408. Thus, device 400 is able to detect, using DV/dt (or in this case DV/di, which is analogous to DV/dt due to a current ramp used by the input current 412), when a specific threshold voltage has been reached for an individual cell, such that it is safe to perform a read of a state of that particular element 402 in view of its particular characteristics.

In an alternate example, the current source for the input current 412 may be located at other positions in the circuit diagram. The element 402 is shown as a schematic for a memristor storage cell. The element 402 may represent a single cell/memristor, with associated circuitry for it. Alternatively, the element 402 may represent a crosspoint array (not specifically shown in FIG. 4A), along with its associated addressing circuitry (whereby device 400 may be universally connected to an element of the crosspoint for individually accessing and identifying the characteristic behavior of elements of the entire crosspoint).

Figure 4B:
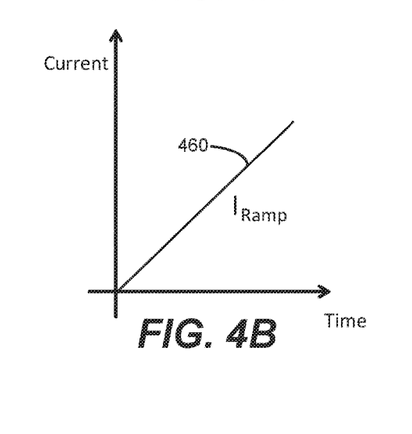
FIG. 4B is a diagram of an input current vs. time of a device according to an example.

FIG. 4B is a diagram of input current vs. time of a device according to an example. The input current expresses a current behavior 460, shown as a linear current ramp.

A device may drive current through a cell, using a current behavior that is a function, such as a linear ramp. The ramp may be associated with a particular slope, such as 1:1 where current linearly increases with time. Driving an element with such a ramp current would cause a voltage across the element to similarly be affected. In taking a temporal derivative of this voltage across the device (as a result of the linear ramp current), a DV/dt curve may be obtained. However, the DV/dt curve would also be related to a DV/di (change in voltage with respect to current), at a ratio corresponding to the slope or ratio of the current-time behavior 460. Thus, for a current behavior 460 slope of 1:1, then DV/dt for a device, based on the temporal derivative with respect to time, would correspond to a DV/di (i.e., derivative with respect to current). Other slopes for current behavior 460 may be used to provide similarly varying relationships between DV/dt and DV/di for a given element (e.g., 1:2, with a corresponding adjustment to the time/current exchange ratio when substituting DV/dt with DV/di). As described herein, an example 1:1 current behavior 460 slope will be used, such that examples will be described in terms of time and current representing similar aspects. Thus, an increase of current may correspond to a similar passage of time. Devices and methods described herein may use such a current ramp for the input current source, driving the element 402 to provide the desired behavior by sweeping the current ramp stimulus along the horizontal axis of FIG. 4B.

Figure 4C:
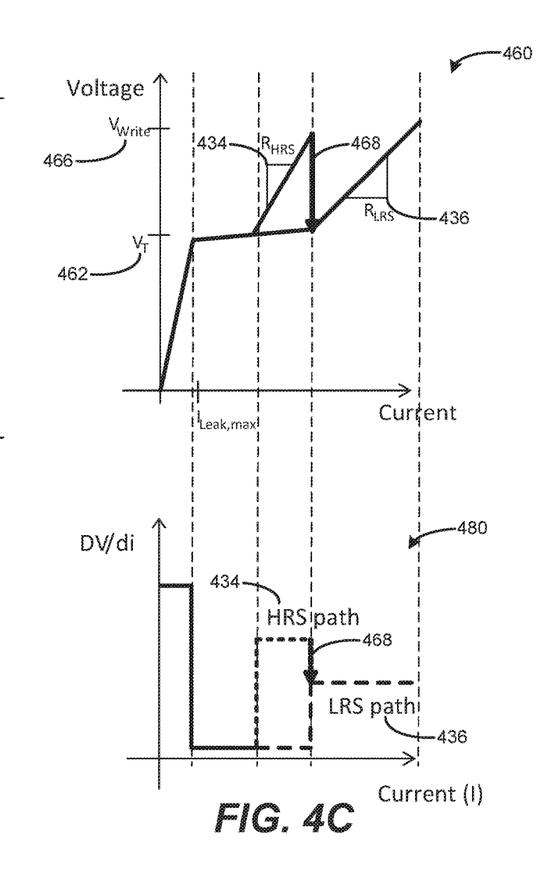
FIG. 4C is a diagram of a voltage vs. current characteristic, aligned with a corresponding diagram of a derivative (voltage/current) vs. current characteristic, of a device according to an example.

FIG. 4C is a diagram of a voltage vs. current characteristic according to a current behavior 460, aligned with a corresponding diagram of a derivative (DV/di) vs. current characteristic (derivative behavior 480), of a device according to an example. The current behavior 460 illustrates an activation threshold voltage $V_T$ 462, a write threshold $V_{Write}$ 466, a high resistive state 434, a low resistive state 436, and a state change 468. The derivative behavior 480 illustrates a derivative of voltage with respect to current, for the current behavior 460, including high resistive state 434, low resistive state 436, and state change 468.

The derivative behavior 480 (DV/di), which is also equivalent to a DV/dt curve due to the approximately 1:1 slope of the input current ramp over time, enables easy identification of a point at which $V_T$ 462, the selector threshold voltage, is crossed. A sharp drop in DV/di is clearly visible in the derivative behavior 480, from a high value to near a low value, representing the corresponding overlapping slope change of the current behavior 460. Thus, consistent with the results of example devices and methods provided herein, the derivative behavior 480 provides a usable signal to trigger an indication that a crossing of $V_T$ 462 has occurred for the given element currently being sensed and/or written. Thus, a module may identify that, e.g., an individualized $V_R$ has been identified for biasing the given element for reading with a wide read margin separation between $V_R$ and $V_{Write}$. The event may be identified by the sharply falling edge of DV/dt (corresponding to the DV/di derivative behavior 480), indicating to, e.g., a device module that an individualized $V_T$ has been crossed in a given cell.

Thus, the example device may elegantly obtain a time derivative for a cell behavior, according to the use of current behavior 460 enabling the DV/di current derivative to correspond to the DV/dt time derivative. In the very first portion of the sweep of the current in the derivative behavior 480 of FIG. 4C, as the current begins to increase, the slope of the corresponding voltage drops off (i.e., before the selector for the element has switched on). Thus, for small change in current, a large change in voltage is obtained, resulting in a large DV/dt, which corresponds to a large DV/di (due to current and time being linearly related via the current behavior 460).

Various techniques also are available for subsequently reading the value of the cell as being in the HRS 434 or the LRS 436, e.g., by a module of an example device in response to reaching the selector threshold voltage, on a per cell basis. For example, to read the cell state, a subsequent rise in voltage may be detected, e.g., as indicated in the increase of DV/di, to either the HRS 434 or the LRS 436. In an alternate example, a level of DV/dt when reaching a voltage threshold may be used to identify whether HRS 434 or LRS 436 is achieved, e.g., by identifying whether the DV/di has plateaued, and to which path the resulting value corresponds. In yet another example, a module may identify a passage of time associated with reaching a threshold. For example, a module may wait for time to pass (corresponding to a current increase) until approximately halfway between the transition to the HRS 434 and the LRS 436, and then check whether the DV/di value corresponds to the HRS path 434 or the LRS path 436. Thus, shortly after an initial pulse associated with reaching $V_T$ 462 for a given individual cell element, examples provided herein may safely proceed to identify whether an element is in the high resistive state or the low resistive state, with a comfortable read margin separating $V_T$ 462 from the state change 468 write threshold voltage.

Figure 5:
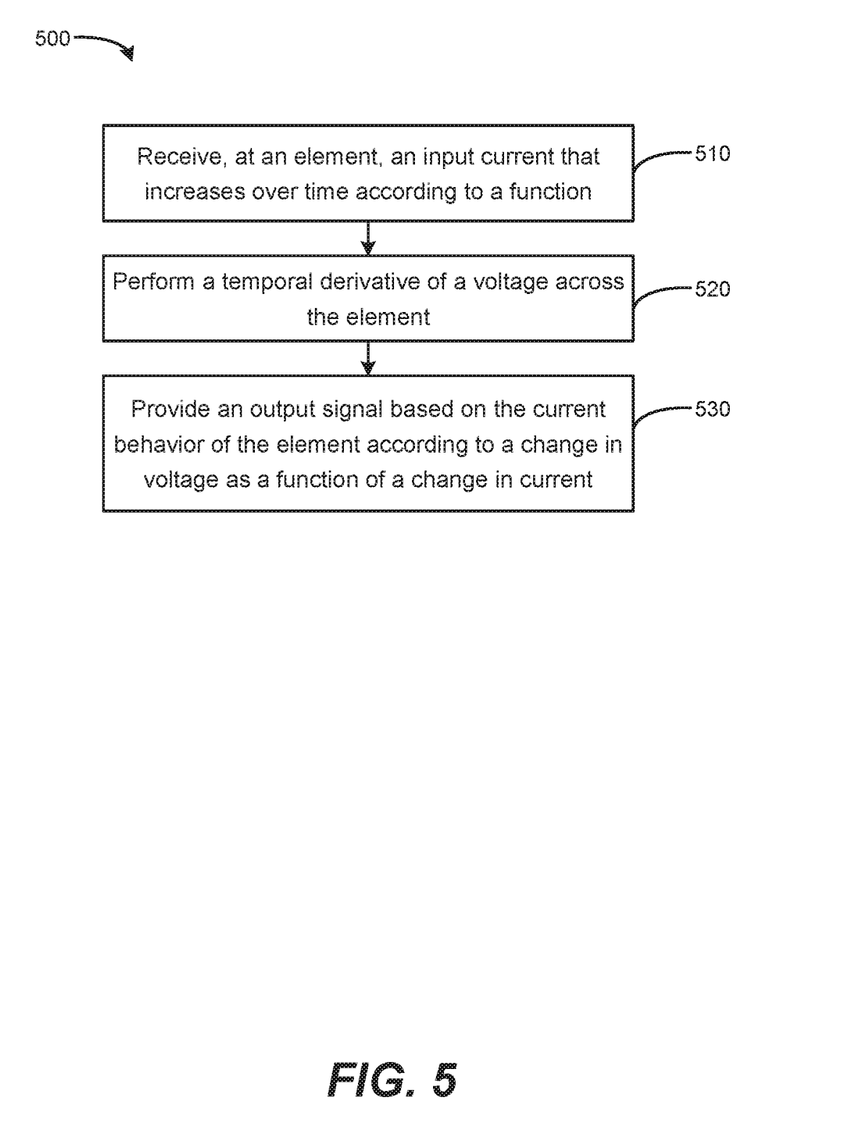
FIG. 5 is a flow chart based on providing an output signal based on a current behavior of an element, according to an example.

Referring to FIG. 5, a flow diagram is illustrated in accordance with various examples of the present disclosure. The flow diagram represents processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 5 is a flow chart 500 based on providing an output signal based on a current behavior of an element, according to an example. In block 510, an input current is received at an element. The input current increases over time according to a function. For example, a first module may include a first node that is coupled to receive the input current, which increases over time as a linear ramp. In block 520, a temporal derivative of a voltage across the element is performed. For example, a second module may include a second node coupled to the first node via a capacitor to perform the temporal derivative. In block 530, an output signal is provided, based on the current behavior of the element according to a change in voltage as a function of a change in current. For example, a third module may include an output node that is coupled via a current mirror to receive the current from the capacitor, and is also coupled via a resistor to provide the output signal at the output node.

What is claimed is:

1. A device comprising:
   a first module coupled to an element whose status is to be determined, wherein the first module is to receive an input current that increases linearly over time;
   a second module, including a capacitor having a first end coupled to the element, to perform a temporal derivative of a voltage across the element; and
   a third module, coupled to a second end of the capacitor of the second module, to provide an output signal based on a current behavior of the element, according to a change in voltage as a function of a change in current, wherein the element is a resistive-state memory cell coupled in series with a non-linear selector, and wherein a common node between the resistive-state memory cell and the non-linear selector is not accessible.

2. The device of claim 1, wherein when the output signal indicates that an activation threshold has been reached, the non-linear selector is activated, indicating a readiness for reading a state of the resistive-state memory cell.

3. The device of claim 1, further comprising a fourth module to bias the element based on the output signal indicating that an activation threshold has been reached for a selector of the element.

4. The device of claim 1, further comprising a fifth module, to read a state of the element as being in one of i) a first resistive state and ii) a second resistive state, wherein the fifth module is to read the state in response to the output signal indicating that an activation threshold has been reached for the element.

5. The device of claim 4, wherein the fifth module is to read the state of the element in response to a subsequent rise in voltage of the output signal, wherein the subsequent rise in voltage is subsequent to the output signal indicating that the activation threshold has been reached.

6. The device of claim 4, wherein the fifth module is to read the state of the element in response to the output signal reaching one of i) a second threshold value and ii) a third threshold value, subsequent to the activation threshold indicating that a non-linear selector is triggered, wherein the second threshold value indicates a voltage consistent with a high resistive state of the element, and the third threshold value indicates a voltage consistent with a low resistive state of the element.

7. The device of claim 4, wherein the fifth module is to read the state of the element based on the value of the output signal, in response to passage of a threshold time period following an indication that the output signal has reached the activation threshold.

8. A device comprising:
a first node coupled to i) an element to receive an input current, and ii) a first terminal of a capacitor, wherein the input current is to be swept across the element as a linear ramp current that increases over time;
a second node coupled to a second terminal of the capacitor, wherein the second node is associated with an output current of the capacitor to obtain a derivative of a voltage across the element; and
an output node coupled to the second node via a current mirror, to provide an output voltage at the output node indicative of a current behavior of the element.

9. The device of claim 8, wherein the output node is further coupled to a resistor to provide the output voltage at the output node.

10. The device of claim 8, wherein the first node is selectively coupled, based on a crosspoint of a plurality of elements, to an individual element whose status is to be determined.

11. A method comprising:
receiving, at an element, an input current that increases linearly over time;
performing, by a capacitor having a first end connected to the element, a temporal derivative of a voltage across the element;
providing, by an output module connected to a second end of the capacitor, an output signal based on the current behavior of the element according to a change in voltage as a function of a change in current; and
reading a state of the element, in response to the output signal indicating that the derivative of the voltage across the element has sharply dropped.

12. The method of claim 11, further comprising biasing the element based on the output signal indicating that an activation threshold has been reached for a selector associated with element.

13. The method of claim 12, further comprising:
reading a state of the element in response to a subsequent rise in voltage of the output signal, wherein the subsequent rise in voltage is subsequent to the output signal indicating that the activation threshold has been reached.

14. The method of claim 12, further comprising:
reading a state of the element in response to the output signal reaching at least one of i) a second threshold value and ii) a third threshold value, subsequent to the activation threshold indicating that the selector is triggered, wherein the second threshold value indicates a voltage consistent with a high resistive state of the element, and the third threshold value indicates a voltage consistent with a low resistive state of the element.

15. The method of claim 11, further comprising:
reading a state of the element based on a value of the output signal, in response to passage of a threshold time period following an indication that the output signal has reached an activation threshold.

* * * * *